United States Patent
Suck et al.

(10) Patent No.: US 11,778,785 B2
(45) Date of Patent: Oct. 3, 2023

(54) ELECTRONIC SYSTEM WITH A HYBRID COOLING SYSTEM

(71) Applicant: Aptiv Technologies Limited, St. Michael (BB)

(72) Inventors: Jochen Suck, Wiehl (DE); Volker Klink, Hennef (DE); Peter Reinhold, Gummersbach (DE); Falk Rademacher, Gummersbach (DE)

(73) Assignee: Aptiv Technologies Limited, St. Michael (BB)

( * ) Notice: Subject to any disclaimer, the term of this patent is extended or adjusted under 35 U.S.C. 154(b) by 161 days.

(21) Appl. No.: 17/385,083

(22) Filed: Jul. 26, 2021

(65) Prior Publication Data
US 2022/0087071 A1 Mar. 17, 2022

(30) Foreign Application Priority Data
Sep. 11, 2020 (EP) .................................... 20195811

(51) Int. Cl.
*H05K 7/20* (2006.01)
*H01L 23/373* (2006.01)

(52) U.S. Cl.
CPC ....... *H05K 7/20436* (2013.01); *H01L 23/373* (2013.01); *H05K 7/20136* (2013.01); *H05K 7/20254* (2013.01)

(58) Field of Classification Search
CPC . H05K 7/20963–20972; H05K 7/2039; H05K 7/20436–20445; H05K 7/1432;
(Continued)

(56) References Cited

U.S. PATENT DOCUMENTS 6,654,252 B2 * 11/2003 Raynham ............. G11B 33/126
361/679.48
7,591,302 B1 * 9/2009 Lenehan ................ H01L 23/473
165/104.33
(Continued)

FOREIGN PATENT DOCUMENTS

DE 102013016464 4/2015
EP 2043416 4/2009
WO 2004057857 7/2004

OTHER PUBLICATIONS

"Extended European Search Report", EP Application No. 20195811.3, dated Mar. 15, 2021, 7 pages.

*Primary Examiner* — Amir A Jalali
(74) *Attorney, Agent, or Firm* — Sawtooth Patent Group PLLC

(57) ABSTRACT

An electronic system is described that comprises a first board and a first processing unit, wherein the first processing unit comprises a first semiconductor chip arranged on a first surface of the first board; a first cooling unit facing the first surface of the first board and configured to cool the first semiconductor chip; at least one further board and a second processing unit, wherein the second processing unit comprises a further semiconductor chip arranged on a first surface of the at least one further board; and a second cooling unit facing the first surface of the at least one further board and configured to cool the further semiconductor chip. The first board and the at least one further board are spaced apart from each other. The first cooling unit is a passive cooling unit, and the second cooling unit is an active cooling unit.

18 Claims, 3 Drawing Sheets

(58) Field of Classification Search
CPC ........... H05K 7/20218; H05K 7/20254; H05K 7/20263; H05K 7/20272; H05K 7/209; H05K 7/20927–20936; H05K 1/0204; H05K 1/0209; H05K 1/0207; H05K 1/181; H01L 23/3672; H01L 23/373; H01L 23/3735; H01L 23/4006; H01L 23/427; H01L 23/473

See application file for complete search history.

(56) References Cited

U.S. PATENT DOCUMENTS

| | | | |
|---|---|---|---|
| 11,287,806 B2* | 3/2022 | Watson, Jr. | H05K 7/20254 |
| 2014/0376187 A1* | 12/2014 | Baba | H05K 1/021 |
| | | | 361/699 |
| 2015/0085442 A1* | 3/2015 | Kondo | H05K 7/20809 |
| | | | 361/679.54 |
| 2015/0327354 A1* | 11/2015 | Umeno | H05K 1/0209 |
| | | | 361/720 |
| 2018/0007776 A1* | 1/2018 | Gareau | H01L 23/367 |
| 2018/0146574 A1* | 5/2018 | Chen | H05K 7/20409 |
| 2019/0274216 A1 | 9/2019 | Kubota et al. | |
| 2020/0042053 A1* | 2/2020 | Cheng | G06F 1/20 |
| 2021/0013124 A1* | 1/2021 | Ikeno | H01L 25/18 |
| 2021/0184544 A1* | 6/2021 | Ikariya | F04D 25/0613 |
| 2021/0195810 A1* | 6/2021 | Joshi | H02K 11/33 |

* cited by examiner

ELECTRONIC SYSTEM WITH A HYBRID COOLING SYSTEM

CROSS REFERENCE TO RELATED APPLICATION

This application claims priority to European Patent Application Number 20195811.3, filed Sep. 11, 2020, the disclosure of which is hereby incorporated by reference in its entirety herein.

BACKGROUND

This application relates to the field of cooling systems for electronic arrangements.

Electronic controller units (ECUs) are embedded systems in automotive electronics that control one or more of the electrical systems or subsystems in a vehicle. A vehicle motor may contain up to 80 ECUs. With the increasing integration of electrical systems in vehicles, there is less and less space for arranging the ECUs inside the vehicle. It is thus necessary to design the ECUs in a compact way, while ensuring that they remain robust, i.e. that at least part of the functions of the ECU can be performed even when the main system fails. The main system comprises a plurality of semiconductor chips arranged on at least a first board. In order to introduce redundancy in the system, a second board may be arranged which functions independently from the main board and can perform at least some of the functions of the main board, should the main board fail.

An electronic controller may comprise a plurality of processing units, e.g. microcontrollers or systems on chips (SoC), which have to be cooled.

There is a need to efficiently cool an electronic system so that it can function properly.

SUMMARY

According to one example, the disclosure is directed to an electronic system that includes a first board and a first processing unit, wherein the first processing unit includes at least one first semiconductor chip arranged on a first surface of the first board; a first cooling unit facing the first surface of the first board and configured to cool the at least one first semiconductor chip; at least one further board and a second processing unit, wherein the second processing unit comprises at least one further semiconductor chip arranged on a first surface of the at least one further board; and a second cooling unit facing the first surface of the at least one further board and configured to cool the at least one further semiconductor chip. The first board and the at least one further board are spaced apart from each other. Further, the first cooling unit is a passive cooling unit and the second cooling unit is an active cooling unit.

In an electronic system of this type, the first board with the first processing unit and the second board with the second processing unit are thermally decoupled and have separate cooling units. Main functions may be implemented in the second processing unit that is cooled by the second cooling unit, and redundant fail operational functions may be implemented in the first processing unit that is cooled by the first cooling unit. The first and second cooling unit are independent, wherein the passive first cooling unit even operates when the active second cooling unit fails. With this, it is possible to keep a backup system implemented by the first processing unit running within one single electronic system even when a main system implemented by the second processing unit fails.

BRIEF DESCRIPTION OF THE DRAWINGS

The embodiments described herein can be better understood with reference to the following description and drawings. The components in the figures are not necessarily to scale, emphasis instead being placed upon illustrating the principles of the embodiments. Furthermore, in the figures, like reference numerals designate corresponding parts.

DETAILED DESCRIPTION

Figure 1:
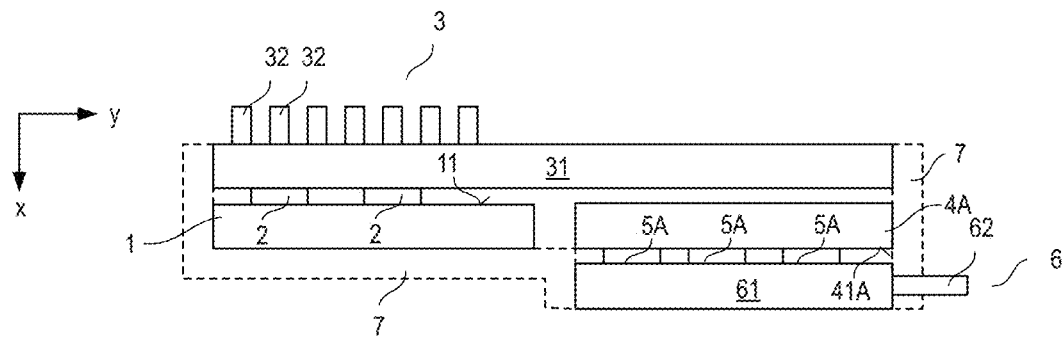
FIG. 1 is a schematic diagram illustrating an electronic system according to one example.

FIG. 1 illustrates one example of an electronic system. This system includes a first board 1, at least one further board 4A, a first cooling unit 3, and a second cooling unit 6. The system further includes a first processing unit with at least one first semiconductor chip 2 arranged on a first surface 11 of the first board 1, and a second processing unit with at least one further semiconductor chip 5A arranged on a first surface 41A of the at least one further board 4A. In the example shown in FIG. 1, the electronic system includes one further board 4A, which is also referred to as second board 4A in the following. The at least one further semiconductor chip 5A arranged on the second board 4A is also referred to as second semiconductor chip 5A in the following.

The system according to FIG. 1 includes several first semiconductor chips 2 on the first surface 11 of the first board and several second semiconductor chips 5A on the first surface 41A of the second board 4A. This, however, is only an example. Basically, the number of first semiconductor chips 2 on the first board 1 is dependent on how many first semiconductor chips 1 are required to perform the desired function of the first processing unit, and the number of second semiconductor chips 5A on the second board 4A is dependent on how many second semiconductor chips 5A are required to perform the desired function of the second processing unit. The first processing may be configured to perform a first set of functionalities, and the second processing may be configured to perform a second set of functionalities. According to one example, the first set is a subset of the second set.

The first cooling unit 3 is configured to cool the at least one first semiconductor chip 2 on the first board 1 and the second cooling unit 6 is configured to cool at least one second semiconductor chip 5A on the second board 4A. In the present example, the first cooling unit 3 and the second cooling unit 6 are spaced apart from each other in a first direction x, which is also referred to as vertical direction in the following.

The first board 1 may be a PCB (Printed Circuit Board). The first surface 11 of the first board 1 faces the first cooling unit 3. The second board 4A may also be a PCB. The first surface 41A of the second board 4A faces the second cooling unit 6.

In the example shown in FIG. 1, the first board and the second board 4A are spaced apart from each other in a second direction y which is perpendicular to the first direction x. This second direction is also referred to as lateral direction or horizontal direction in the following. Furthermore, both the first board 1 and the second board 4A, in the vertical direction x, are arranged between the first cooling unit 3 and the second cooling unit 6. As the first surface 11 of the first board 1 faces the first cooling unit 3 and the first surface 41A of the second board 4A faces the second cooling unit 6, the first surface 11 of the first board 1 and the first surface 41A of the second board 4A face in opposite direction. That is, the first surface 41A of the second board 4A is flipped by 180 degrees relative to the first surface 11 of the first board 1.

In accordance with one example, the second processing unit on the second board 4A is configured to perform a main functionality of a main system. For example, the second board 4A may be configured to control a driving assistance system in a vehicle. The first processing unit on the first board 1 may be a fail operational unit configured to perform only a subset of the main functionality and to take over if the main system 4A fails. The first processing unit on the first board 1 is thus at least partially redundant to the second processing unit on the second board 4A. The first processing unit on the first board 1 can be seen as a backup unit with reduced functionality and can work independently from the second processing on the second board 4A. The semiconductor chips 2, 4A may be any kind of integrated circuits such as System-on-Chips (SoC) or microcontrollers.

In the example illustrated in FIG. 1, the first board 1 and the second board 4A are arranged spaced apart from each other in the second direction y. In this way, the first board 1 and the second board 4A are thermally decoupled.

The first cooling unit 3 is a passive cooling unit configured to cool the first semiconductor chips 2 of the first board 1 by natural convection or radiation. Passive cooling is a cooling technology which does not involve external devices, such as pumps or fans, and thus does not use any additional energy. Instead, it makes use of the architecture design of the object to be cooled, typically relying on heat sinks and heat spreaders, in order to increase the heat transfer only by natural convection and radiation. Passive cooling has the advantage to be both energy-efficient and cost-efficient. In the depicted example, the first cooling unit 3 includes a cooling plate 31 that is in thermal contact with the first semiconductor chips 2 and faces the first surface 11 of the first board 1. The cooling plate 31 extends along the second direction y and may cover both the first board 1 and the second board 4A. The cooling unit may further include a plurality of cooling ribs 32 protruding from a surface of the cooling plate 31 that faces away from the first board 1 so that the heat produced by the semiconductor chips 2 can be carried away from the board 1 via the cooling plate 31 and the cooling ribs 32. With this, the board 1 can be cooled by the first cooling unit 3 at any time without the need of actively circulating fluids and independently from the second board 4A. The cooling plate 31 may be made of a metallic material such as aluminum. The cooling ribs 32 are plates protruding in a direction that is normal to the outer surface of the cooling plate 31 and arranged parallel to each other with a constant gap between each other. The cooling ribs 32 may only be arranged on the part of the cooling plate 31 which is arranged above the first board 1. The cooling ribs 32 increase the surface of the cooling plate 31. In other examples, other metal components can be added to the cooling plate 31 in order to increase the heat exchange surface. Passive cooling has the advantage that a cooling always takes place independently from the environment and the working conditions. Passive cooling does not have as good an efficiency as active cooling, in which a fluid actively circulates and transports heat. However, since the first board 1 only has reduced functionality with regard to the main board 4A, the passive cooling unit 3 is able to ensure a sufficient cooling for the semiconductor chips 2. In other examples, the first cooling unit is an active cooling unit that is independent from the second cooling unit 6.

The second cooling unit 6 is an active cooling unit configured to cool the second semiconductor chips 4A via an actively circulating fluid such as air or water. Active cooling is a cooling technology which relies on an external device to enhance heat transfer. Typically, the device, which can be a fan or a pump, forces the circulation of a fluid, such as a gas or a liquid, thereby increasing the fluid flow and the heat transfer. Active cooling can generally yield a much high heat transfer than passive cooling, but has the disadvantage of being costly and using electricity. The second cooling unit 6 includes a cooling plate 61 that is in thermal contact with the semiconductor chips 5A and thus faces the first surface 41A of the second board 4A. The cooling unit 6 further includes at least one tube 62 through which the cooling fluid, which may be put into motion by a fan or a pump, can enter and leave the cooling plate 61. The circulating fluid transfers the heat produced by the semiconductor chips 5A to a central heat exchange system (not shown) so that the second board 4A can be actively cooled. In the depicted example, the first board 1 and the second board 4A are arranged between the cooling plate 31 of the first cooling unit 3 and the cooling plate 61 of the second cooling unit 6. According to one example (as illustrated), the cooling plate 6 does not extend beyond the second board 4A in the second direction y, and in particular does not extend until the first board 1. With this, a very compact structure can be obtained.

The first board 1 is only cooled by the passive first cooling unit 3 while the second board 4A is only cooled by the active second cooling unit 6. If the active cooling fails, the second board 6 cannot be cooled properly anymore and the second processing unit, which may be the main processing unit, fails. However, since the first board 1, which may be the backup board, is cooled independently from the second board 4A by the passive cooling unit 3, the first processing unit keeps working and can take over at least partly so that at least some of the functions of the main unit can still be carried out. With this, a very robust electronic system can be achieved.

Referring to the above, the first cooling unit 3 is in thermal contact with the at least one first semiconductor chip 2 on the first board 1, and the second cooling unit 6 is in thermal contact with the at least one second semiconductor chip 5A on the second board 4A. This may include that the cooling plate 31, 61 of the respective cooling unit 3, 6 is in direct contact with the respective semiconductor chip 2, 5A or that a thermal paste is arranged between the cooling plate 31, 61 and the respective semiconductor chip 2, 5A. Each of the semiconductor chips 2, 5A may include a semiconductor die and a semiconductor package encapsulating the die, wherein the cooling plate 31, 61 and/or the thermal paste is in contact with the respective semiconductor package.

The first board 1 and the second board 4A may arranged within a sealed housing 7 (illustrated in dashed lines). The housing may be made of aluminum in order to ensure good thermal conductivity. As illustrated, the cooling plate 31 of the first cooling unit 3 may form a part of the housing 7. In this case, the cooling ribs 32 are arranged on an outside of the housing 7 and make it possible that the at least one first semiconductor chip 2 is cooled by natural convection and radiation to keep the first processing unit running even when the second processing unit fails. Referring to FIG. 1, the cooling plate 61 of the second cooling unit may form another part of the housing.

Figure 6A:
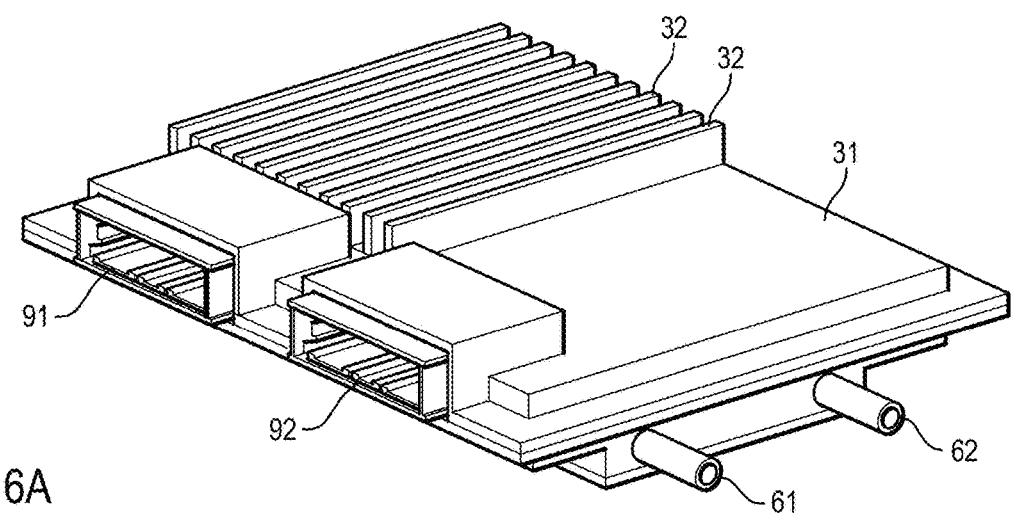
FIGS. 6A and 6B show a perspective view (FIG. 6A) and a sectional view (FIG. 6B) of an electronic system in greater detail.
Figure 6B:
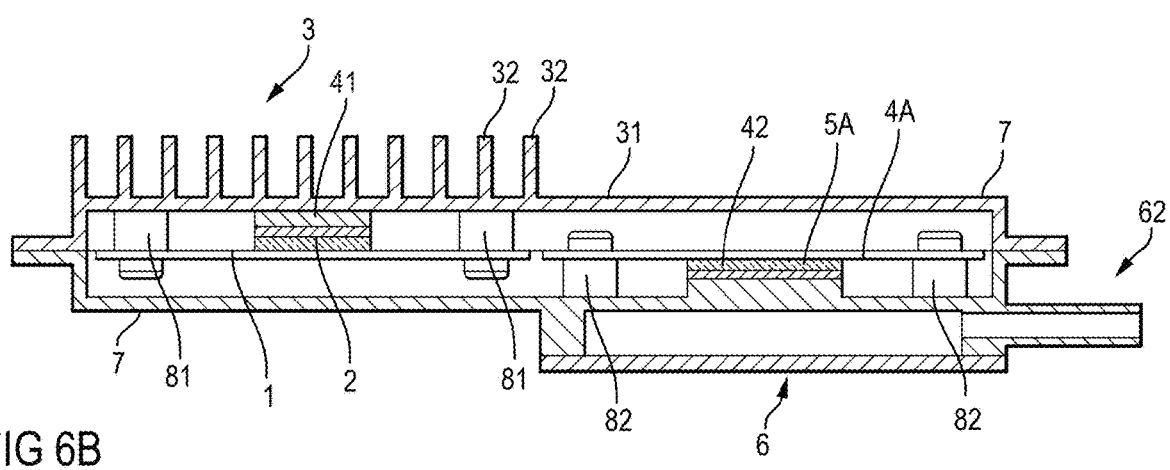

FIGS. 6A and 6B show a possible implementation of an electronic system of the type shown in FIG. 1 in a perspective view (FIG. 6A) and in a sectional view (FIG. 6B). Referring to FIG. 6A, the housing 7 may comprise a first opening 91 for electrical connection with the first board 1 and a second opening 92 for electrical connection with the second board 4A. The second cooling unit 6 may comprise one tube with an inlet 61 and an outlet 62 for the circulation of the cooling fluid.

Further, as can be seen from FIG. 6B, the cooling plate 31 of the first cooling unit 3 may be part of the housing 7 encapsulating the first board 1 and the second board 4A. The first board 1 may be mechanically attached to the cooling plate 31 of the first cooling unit 3 by screws 81 and the second board may be mechanically attached to the cooling plate 61 of the second cooling unit 6 by screws 82. The at least one first semiconductor chip 2 of the first board 1 may be thermally coupled to the cooling plate 31 of the first cooling unit 3 by thermal paste 41 and the semiconductor chip 5A of the second board 4A may be thermally coupled to the cooling plate 61 of the second cooling unit 6 by thermal paste 42. With this, the first board 1 and the second board 4A can be logically, thermally, and electrically independent from each other.

Figure 2:
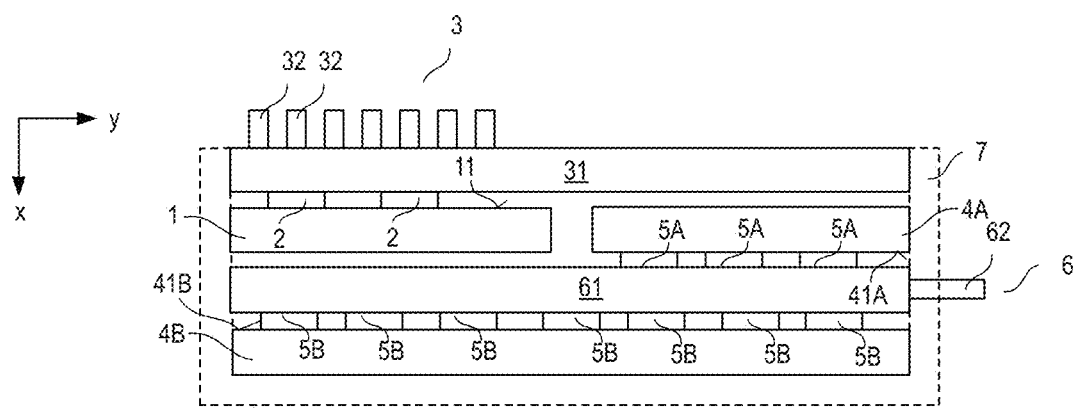
FIG. 2 is a schematic diagram illustrating an electronic system according to a further example.

FIG. 2 illustrates a second example of an electronic system. The electronic system according to FIG. 2 is based on the electronic system according to FIG. 1 and mainly differs from the electronic system according to FIG. 1 in that it further comprises a third board 4B having a plurality of third semiconductor chips 5B on a first surface 41B. The third board 4B is spaced apart in the first direction x from the first board 1 and the second board 4A are arranged so that the second cooling unit 6 is arranged between the first and second board 1, 4A and the third board 4B.

In the example illustrated in FIG. 2, the first surface 41B of the third board 4B faces the active second cooling unit 6 and the third semiconductor chips 5B are in thermal contact with the second cooling unit 6 so that they can be cooled by the fluid circulating through the active cooling plate 61. The first surface 41B of the third board 4B faces the first surface 41A of the second board 4A and the at least one semiconductor chip 5A on the second board 4A and the at least one semiconductor chip 5B on the third board 4B are in thermal contact with the second cooling plate 61 on opposite sides of the second cooling plate 61.

Different from the example shown in FIG. 1, the active cooling plate 61 according to FIG. 2 extends along the second direction y such that it covers on one side both the first board 1 and the second board 4A, and on the other side the whole third board 4B. With this, the second cooling unit is able to cool all the third semiconductor chips 5B arranged on the third board 4B. The third board 4B is larger than the second board 4A in the second direction y so that a larger number of third semiconductor chips 5B can be arranged on the third board 4B than the number of second semiconductor chips 5A on the second board 4A. The third board 4B is arranged within the same sealed housing 7 as the first board 1 and the second board 4A.

Like the second board 4A, the third board 4B may be a PCB. According to one example, the at least one third semiconductor chip 5B on the third board 4B is part of the second processing unit. The semiconductor chips of the second processing unit are thus arranged on two different boards 4A, 4B cooled by the same active second cooling system 6. With this, an increased number of semiconductor chips for the second processing unit (the main system) can be arranged within the same housing without the need for further cooling systems.

Figure 5:
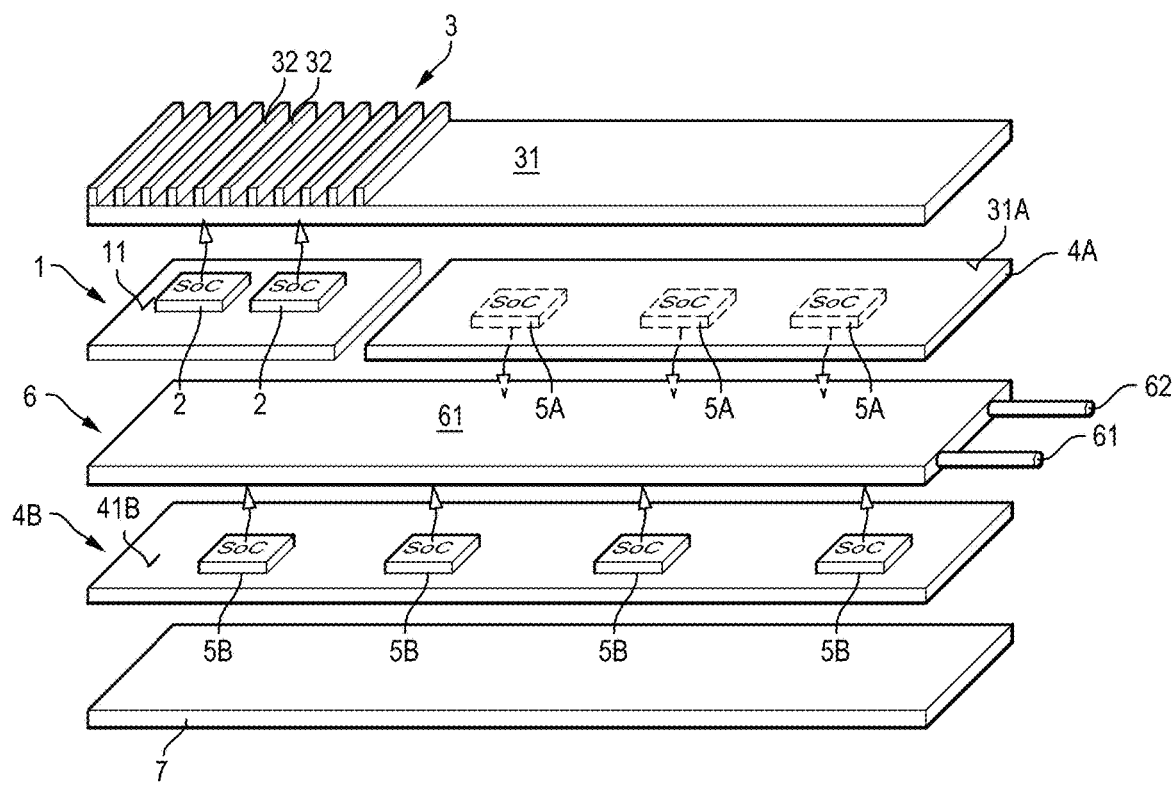
FIG. 5 is an exploded perspective view of the electronic system of FIG. 2.

FIG. 5 illustrates an exploded view of the electronic system of FIG. 2 in a perspective representation. The heat generated by the various semiconductor chips 2, 5A, 5B is represented by arrows. As can be seen from FIG. 5, the heat of the first semiconductor chips 2 of the first board 1 is transferred to the passive cooling plate 31 and the cooling ribs 32 of the first cooling unit 3. The heat of the second semiconductor chips 5A of the second board 4A and of the third semiconductor chips 5B of the third board 4B is transferred to the active cooling plate 61 of the second cooling unit 6. If the active second cooling unit 6 fails, for example if the fan or pump moving the cooling fluid stops working, the heat generated by the second and third semiconductor chips 5A, 5B cannot be dissipated anymore so that there is the risk that the second processing unit fails. However, the heat produced by the second semiconductor chips 2 will still be transferred to the first cooling unit 3 and be dissipated by natural convection and radiation so that the first processing unit will keep functioning and can take over some of the functions which the second processing unit cannot perform any longer. This hybrid cooling system that includes the first and second cooling units 3, 6 combined with the thermal independence between the second and third boards 4A, 4B on the one side and the first board 1 on the other side ensure a very robust system which is able to function even when the second cooling unit 6 of the main system fails.

Figure 3:
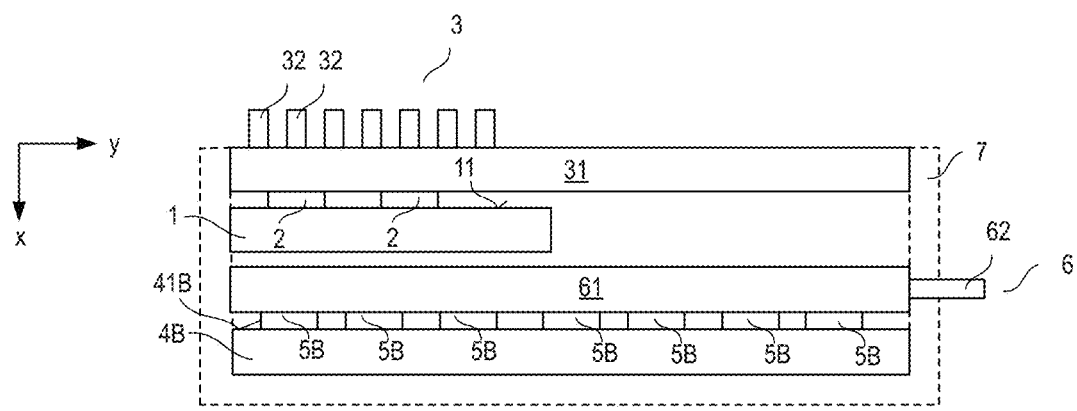
FIG. 3 is a schematic diagram illustrating an electronic system according to a further example.

FIG. 3 illustrates another example of an electronic system. The electronic system according to FIG. 3 differs from the electronic system according to FIG. 2 in that the system does not comprise the second board 4A. The third board 4B is configured to perform alone the first functionalities of the main system. Only the third board 4B is cooled by the active second cooling unit 6. The first board 1 and the third board 4B are arranged on opposite sides of the second cooling unit 6 and thus spaced apart from each other in the first direction x. Compared to the system of FIG. 1, the thermal isolation between the first processing unit and the second processing unit is improved.

Figure 4:
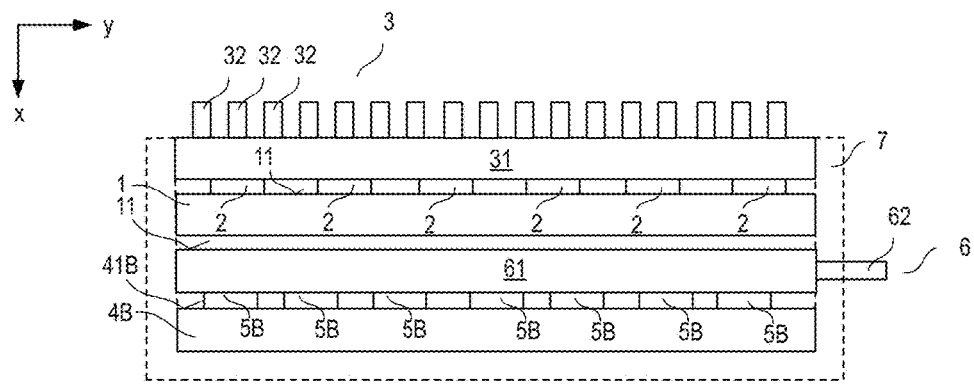
FIG. 4 is a schematic diagram illustrating an electronic system according to a further example.

FIG. 4 illustrates another example of an electronic system. The electronic system according to FIG. 4 differs from the electronic system according to FIG. 3 in that the first board 2 extends in the second direction y over the whole length of the passive cooling plate 31 of the first cooling unit 3. The first board 2 also extends over the whole length of the active cooling plate 61 of the second cooling unit 6. With this, a larger number of first semiconductor chips 2 can be arranged on the first surface 11 of the first board 1 compared to the shorter first board of FIG. 1. In order to be able to cool all the first semiconductor chips 2 of the first board 1, the cooling ribs 32 of the first cooling unit 3 are arranged on the whole cooling plate 31 in the second direction y.

The electronic system explained above, may be used to implement an ECU of a vehicle, wherein the second processing unit may form a main processing unit (main unit) and the first processing unit may form a fail operational unit, which is partially redundant to the main unit and can operate independently from the main unit.

Although various embodiments have been illustrated and described with respect to one or more specific implementations, alterations and/or modifications may be made to the illustrated examples without departing from the spirit and scope of the features and structures recited herein. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the present disclosure.

What is claimed is:

1. An electronic system, comprising:
   a first board;
   a first processing unit arranged on a first surface of the first board, the first processing unit comprising at least one first semiconductor chip;
   a first cooling unit facing the first surface of the first board and configured as a passive cooling unit to cool the at least one first semiconductor chip;
   a second board spaced apart from the first board in a first direction;
   a second processing unit arranged on a second surface of the second board, the second processing unit comprising at least one second semiconductor chip, the second surface facing opposite the first surface; and
   a second cooling unit facing the second surface of the second board and configured as an active cooling unit to cool the at least one second semiconductor chip, the first cooling unit and the second cooling unit being spaced apart from each other in a second direction that is perpendicular to the first direction.

2. The electronic system of claim 1, wherein the electronic system further comprises:
   a third board spaced apart from the first board and the second board in the second direction with the second cooling unit arranged in between the third board and the second board; and
   a third processing unit is arranged on first surface of the third board, the third processing unit comprising at least one third semiconductor chip, the first surface of the third board facing the second cooling unit.

3. The electronic system of claim 2, wherein:
   the second cooling unit extends along the first direction such that it faces both the second surface of the second board and the second surface of the first board.

4. The electronic system of claim 3, wherein the first board and the second board are arranged between the first cooling unit and the second cooling unit.

5. The electronic system of claim 1, wherein the first cooling unit comprises:
   a cooling plate that is in thermal contact with the at least one first semiconductor chip; and
   cooling ribs protruding from a surface of the cooling plate that faces away from the first board.

6. The electronic system of claim 1, wherein the second cooling unit comprises:
   a cooling plate that is in thermal contact with the at least one second semiconductor chip; and
   at least one tube arranged inside the cooling plate and configured to conduct a cooling liquid.

7. The electronic system of claim 1, further comprising:
   a housing configured to encapsulate the first board and the second board.

8. The electronic system of claim 7, wherein at least one of the first and the second cooling unit forms a portion of the housing.

9. The electronic system according to claim 1, wherein the first processing unit is redundant to the second processing unit.

10. The electronic system of claim 9, wherein:
    the first processing unit is configured to perform a first set of functionalities,
    the second processing unit is configured to perform a second set of functionalities independently of the first processing unit, and
    the first set of functionalities is a subset of the second set of functionalities.

11. The electronic system of claim 1, wherein the first board comprises a printed circuit board.

12. The electronic system of claim 1, wherein the second board comprises a printed circuit board.

13. The electronic system of claim 1, wherein the first processing unit is configured to perform a main function of a main system and the second processing unit is configured to perform a reduced function independent from the main function of the main system.

14. The electronic system of claim 13, wherein the second processing unit is configured to perform the reduced function regardless of whether the main system fails.

15. The electronic system of claim 1, wherein the electronic system is part of an electronic control unit.

16. The electronic system of claim 15, wherein the first and second cooling units comprise a hybrid cooling system of the electronic control unit.

17. The electronic system of claim 16, wherein the electronic control unit is configured for use in a vehicle.

18. The electronic system of claim 17, wherein the electronic control unit is configured to operate the vehicle using the hybrid cooling system of the electronic control unit to keep the electronic control unit operating within temperature limits of the vehicle.

* * * * *